(12) United States Patent
Hayashi et al.

(10) Patent No.: US 9,814,136 B2
(45) Date of Patent: Nov. 7, 2017

(54) WIRING BOARD, MOUNTING STRUCTURE EQUIPPED WITH THE WIRING BOARD, AND METHOD FOR MANUFACTURING WIRING BOARD

(71) Applicant: KYOCERA Corporation, Kyoto-shi, Kyoto (JP)

(72) Inventors: Katsura Hayashi, Kyoto (JP); Keisaku Matsumoto, Kyoto (JP)

(73) Assignee: KYOCERA CORPORATION, Kyoto-shi, Kyoto (JP)

(*) Notice: Subject to any disclaimer, the term of this patent is extended or adjusted under 35 U.S.C. 154(b) by 110 days.

(21) Appl. No.: 14/417,592

(22) PCT Filed: Jul. 25, 2013

(86) PCT No.: PCT/JP2013/070173
§ 371 (c)(1),
(2) Date: Jan. 27, 2015

(87) PCT Pub. No.: WO2014/021186
PCT Pub. Date: Feb. 6, 2014

(65) Prior Publication Data
US 2015/0305154 A1    Oct. 22, 2015

(30) Foreign Application Priority Data

Aug. 1, 2012 (JP) .................. 2012-171186
Sep. 10, 2012 (JP) .................. 2012-198256

(51) Int. Cl.
*H05K 1/00* (2006.01)
*H05K 1/11* (2006.01)
(Continued)

(52) U.S. Cl.
CPC ............ *H05K 1/112* (2013.01); *H01L 23/145* (2013.01); *H01L 23/49822* (2013.01);
(Continued)

(58) Field of Classification Search
CPC ...... H05K 1/112; H05K 1/0298; H05K 1/181; H05K 3/4602; H05K 2201/02;
(Continued)

(56) References Cited

U.S. PATENT DOCUMENTS 5,527,604 A * 6/1996 Hayashi ............... H01L 23/142
257/E23.006
2004/0096634 A1* 5/2004 Taga ....................... H01L 23/15
428/210
(Continued)

FOREIGN PATENT DOCUMENTS

JP    2003-110246 A    4/2003
JP    2004-250674 A    9/2004
(Continued)

OTHER PUBLICATIONS

English Translation JP2003-110246.*
(Continued)

*Primary Examiner* — Steven T Sawyer
(74) *Attorney, Agent, or Firm* — Volpe and Koenig, P.C.

(57) ABSTRACT

A wiring board includes a first electrically-conductive layer; and a first resin layer covering the first electrically-conductive layer, the first resin layer including a resin portion and inorganic insulating particles dispersed in the resin portion. The first resin layer has a first layer region which is in contact with one main surface and side surfaces of the first electrically-conductive layer, and a second layer region which is located on a side of the first layer region which side is opposite to the first electrically-conductive layer. The inorganic insulating particles include a plurality of first inorganic insulating particles contained in the first layer region, and a plurality of second inorganic insulating particles contained in the second layer region. A content rate of the first inorganic insulating particles in the first layer region (Continued)

is lower than a content rate of the second inorganic insulating particles in the second layer region.

6 Claims, 10 Drawing Sheets

(51) Int. Cl.
 *H01L 23/498* (2006.01)
 *H05K 3/46* (2006.01)
 *H01L 23/14* (2006.01)
 *H05K 1/02* (2006.01)
 *H05K 1/18* (2006.01)

(52) U.S. Cl.
 CPC .. *H01L 23/49827* (2013.01); *H01L 23/49894* (2013.01); *H05K 1/0298* (2013.01); *H05K 1/181* (2013.01); *H05K 3/4602* (2013.01); *H05K 3/4655* (2013.01); *H01L 2224/16* (2013.01); *H01L 2224/16225* (2013.01); *H01L 2924/15174* (2013.01); *H05K 2201/0175* (2013.01); *H05K 2201/0195* (2013.01); *H05K 2201/029* (2013.01); *H05K 2201/0209* (2013.01); *H05K 2201/0269* (2013.01)

(58) Field of Classification Search
 CPC ... H05K 2201/0203; H05K 2201/0206; H05K 2201/0209
 See application file for complete search history.

(56) References Cited

U.S. PATENT DOCUMENTS

| | | | |
|---|---|---|---|
| 2004/0214005 A1 | 10/2004 | Hayashi et al. | |
| 2007/0164349 A1* | 7/2007 | Nakasato | H01L 21/6835 257/318 |
| 2009/0057928 A1* | 3/2009 | Zhai | H01L 21/563 257/789 |
| 2009/0296364 A1* | 12/2009 | Yamamoto | H01L 21/563 361/820 |
| 2010/0259910 A1* | 10/2010 | Hayashi | B32B 5/28 361/783 |
| 2011/0024170 A1* | 2/2011 | Nagasawa | H05K 1/036 174/258 |
| 2011/0215478 A1 | 9/2011 | Yamamichi et al. | |
| 2013/0149514 A1 | 6/2013 | Hayashi | |

FOREIGN PATENT DOCUMENTS

| | | |
|---|---|---|
| JP | 2011-187473 A | 9/2011 |
| WO | 2012/014875 A1 | 2/2012 |

OTHER PUBLICATIONS

Kyocera WO2011037260.*
WO2011096384, English translation.*
JP H08-097526 English Translation 1996.*
International Search Report, PCT/JP2013/070173, dated Oct. 15, 2013, 4 pgs.
Japanese Reconsideration Report with English concise explanation, Japanese Patent Application No. 2014-528102, Apr. 27, 2016, 3 pgs.

* cited by examiner (a)

(b)

(a)

(b)

(a)

(b)

(a)

(b)

WIRING BOARD, MOUNTING STRUCTURE EQUIPPED WITH THE WIRING BOARD, AND METHOD FOR MANUFACTURING WIRING BOARD

TECHNICAL FIELD

The present invention relates to a wiring board for use in electronic equipment, a mounting structure equipped with the wiring board, and a method for manufacturing a wiring board.

BACKGROUND ART

As a mounting structure for use in electronic equipment, there is heretofore known a structure in which an electronic component is mounted on a wiring board.

For example, in Japanese Unexamined Patent Publication JP-A 2011-187473, there is disclosed a wiring board comprising an electrically-conductive layer and a resin layer which covers the electrically-conductive layer. The resin layer includes a resin portion and inorganic insulating particles dispersed in the resin portion, and is in contact with one main surface and side surfaces of the electrically-conductive layer.

Since the inorganic insulating particle and the resin portion differ from each other in material characteristics, it follows that the adhesion strength between the inorganic insulating particle and the resin portion is low. Meanwhile, when reflow soldering is carried out for the installation of an electronic component on the wiring board, the wiring board is subjected to heat. At this time, concentration of thermal stress resulting from the difference in thermal expansion coefficient between the electrically-conductive layer and the resin layer tends to occur in the vicinity of a corner between one main surface and the side surface of the electrically-conductive layer. In consequence, a crack may be developed from the corner toward the adherent surfaces of the resin portion and the inorganic insulating particle bonded to each other with low adhesion strength. This cracking is prone to occur especially when a content rate of the inorganic insulating particles is increased in order to lower the thermal expansion coefficient of the wiring board with the aim of improving the reliability of connection between the wiring board and the electronic component.

If such a crack appears in the resin layer, when a voltage is applied to the electrically-conductive layer, part of the electrically-conductive layer ionized by the voltage will find its way into the crack, with the result that the adjacent electrically-conductive layers are susceptible to electrical short-circuiting (ion migration). This leads to deterioration of the electrical reliability of the wiring board.

SUMMARY OF INVENTION

An object of the invention is to provide a wiring board with improved electrical reliability, a mounting structure equipped with the wiring board, and a method for manufacturing a wiring board.

A wiring board in accordance with one embodiment of the invention includes a first electrically-conductive layer, and a first resin layer covering the first electrically-conductive layer, the first resin layer including a resin portion and a plurality of inorganic insulating particles dispersed in the resin portion. The first resin layer has a first layer region which is in contact with one main surface and side surfaces of the first electrically-conductive layer, and a second layer region which is located on a side of the first layer region which side is opposite to the first electrically-conductive layer. The plurality of inorganic insulating particles including a plurality of first inorganic insulating particles contained in the first layer region, and a plurality of second inorganic insulating particles contained in the second layer region. A content rate of the first inorganic insulating particles in the first layer region is lower than a content rate of the second inorganic insulating particles in the second layer region.

According to the wiring board in accordance with one embodiment of the invention, the electrical reliability of the wiring board can be improved.

BRIEF DESCRIPTION OF DRAWINGS

FIG. 4(d) is an enlarged view of a section A4 as shown in FIG. 4(c);

FIG. 11(d) is an enlarged view of a section A11 as shown in FIG. 11(c);

FIG. 16(d) is an enlarged view of a section A14 as shown in FIG. 16(c).

DESCRIPTION OF EMBODIMENTS

First Embodiment (Mounting Structure)

Hereinafter, a mounting structure equipped with a wiring board in accordance with a first embodiment of the invention will be particularized with reference to drawings.

Figure 1:
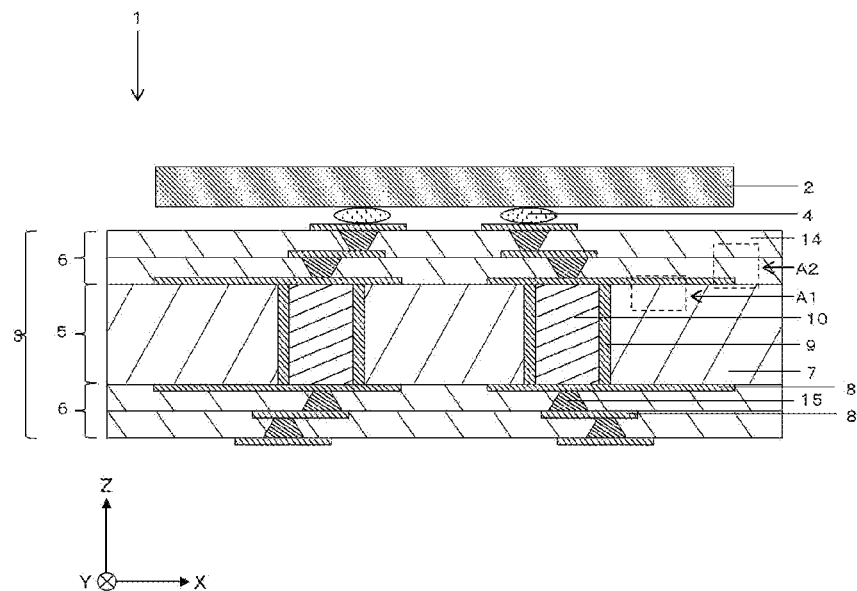
FIG. 1 is a sectional view of a mounting structure in accordance with a first embodiment of the invention taken along a thickness-wise direction (Z direction) thereof.

A mounting structure 1 as shown in FIG. 1 is used for electronic equipment, for example, audio visual equipment of various types, household electrical appliances, communications equipment, computer apparatuses or computer peripherals, and so forth. The mounting structure 1 includes an electronic component 2 and a wiring board 3 with the electronic component 2 mounted on one main surface thereof.

The electronic component 2 is a semiconductor element such for example as IC, LSI, CMOS, or LED, or an acoustic wave element such as a SAW device. The electronic component 2 is flip-chip mounted on the wiring board 3 via a bump 4 made of an electrically-conductive material such as solder. The electronic component 2 is made of a semiconductor material such for example as silicon, germanium, gallium arsenide, gallium arsenide phosphide, gallium nitride, or silicon carbide.

(Wiring Board)

The wiring board 3 has the functions of supporting the electronic component 2 and providing the electronic component 2 with the supply of power and signals to drive or control the electronic component 2. The wiring board 3 includes a core substrate 5, and buildup layers 6 formed, as a pair, on opposed main surfaces of the core substrate 5, respectively.

(Core Substrate)

The core substrate 5 includes: a base body 7; electrically-conductive layers 8 formed, as a pair, on opposed main surfaces of the base body 7, respectively; a cylindrical through-hole conductor 9 formed so as to pass through the base body 7, for establishing electrical connection between the paired electrically-conductive layers 8; and an insulator 10 filled inside the through-hole conductor 9.

Figure 2:
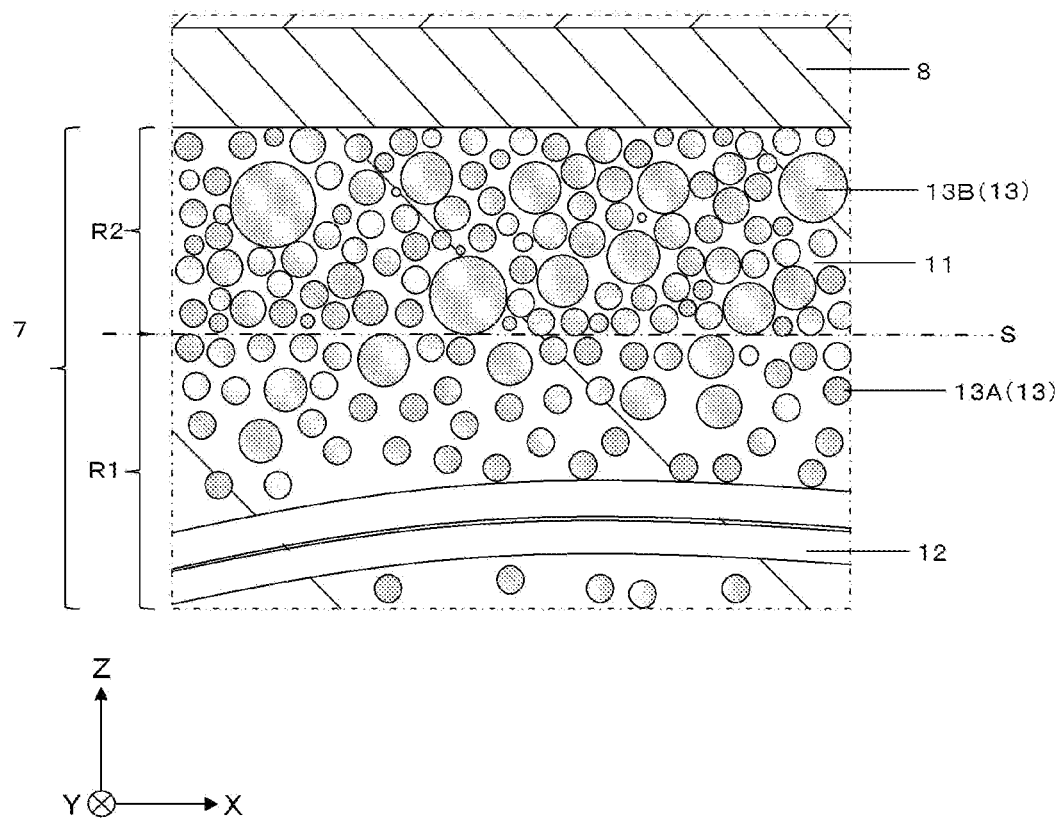
FIG. 2 is an enlarged view of a section A1 of the mounting structure shown in FIG. 1.

As shown in FIG. 2, the base body 7 includes: a first resin portion 11; a base material 12 covered with the first resin portion 11; and a plurality of first inorganic insulating particles 13A and a plurality of second inorganic insulating particles 13B contained in the first resin portion 11 (hereafter also referred to as "a plurality of inorganic insulating particles 13"). The base body 7 has a first layer region R1, and second layer regions R2 located, as a pair, on opposed main surfaces of the first layer region R1, respectively. The first layer region R1 comprises: the first resin portion 11; the base material 12 placed inside the first resin portion 11; and the plurality of first inorganic insulating particles 13A contained in the first resin portion 11. The second layer region R2 comprises: the first resin portion 11; and the plurality of second inorganic insulating particles 13B contained in the first resin portion 11. The second layer region R2 of the present embodiment does not include the base material 12.

As shown in FIG. 2, a boundary surface S in the form of an arrangement of the first inorganic insulating particles 13A or the second inorganic insulating particles 13B may be formed between the first layer region R1 and the second layer region R2 in the base body 7.

The thickness of the first layer region R1 of the base body 7 falls in a range of 25 μm or more and 1200 μm or less, for example. The thickness of the second layer region R2 of the base body 7 falls in a range of 5 μm or more and 50 μm or less, for example. The content rate of the first inorganic insulating particles 13A in the first layer region R1 of the base body 7 falls in a range of 2% by volume or above and 40% by volume or below, for example. The content rate of the second inorganic insulating particles 13B in the second layer region R2 of the base body 7 falls in a range of 45% by volume or above and 85% by volume or below, for example.

It is noted that the thickness of the first layer region R1 or the second layer region R2 of the base body 7 is determined by performing the following steps: observing the section of the base body 7 taken along the thickness-wise direction thereof under a scanning electron microscope (SEM); measuring the length of each of 10 or more places of the section along the thickness-wise direction; and calculating the mean value of the measurement data. The content rate of the resin portion 11 in the base body 7 (% by volume), the content rate of the base material 7 in the base body 7 (% by volume), and the content rate of the inorganic insulating particles 13 in the base body 7 (% by volume) are determined by performing the following steps: measuring the area ratio (% by area) between the base body and each of the resin portion, the base, and the inorganic insulating particles by means of an image analyzer or otherwise with reference to images of the section of the base body 7 along the thickness-wise direction taken by a SEM; and defining the measured area ratios as volume ratios (% by volume).

The first resin portion 11 constitutes the main part of the base body 7. The first resin portion 11 is made of a resin material such for example as epoxy resin, bismaleimide triazine resin, cyanate resin, wholly aromatic polyamide resin, or polyimide resin.

The base material 12 is intended to increase the Young's modulus of the base body 7, as well as to decrease the thermal expansion coefficient of the base body 7. The base material 12 is, for example, a fiber-made woven or nonwoven fabric, or a cloth made by arranging fibers in one direction. Examples of the fibers include glass fibers, resin fibers, and carbon fibers.

The first inorganic insulating particle 13A is intended to increase the Young's modulus of the base body 7, as well as to decrease the thermal expansion coefficient of the base body 7. The first inorganic insulating particle 13A is made of an inorganic insulating material such for example as silicon oxide, aluminum oxide, magnesium oxide, or calcium oxide, and, among them, silicon oxide is particularly desirable for use.

The average particle size of the first inorganic insulating particles 13A falls in a range of 0.2 μm or more and 2 μm or less, for example. The maximum particle size of the plurality of first inorganic insulating particles 13A falls in a range of 1 μm or more and 3 μm or less, for example. The average particle size of the first inorganic insulating particles 13A is determined by performing the following steps: observing the section of the base body 7 along the thickness-wise direction under a SEM; taking a photograph of the section enlarged so that the contained particles ranging in number from 20 or more and 50 or less can be seen; measuring the maximum width of each particle on the basis of the enlarged section image; and averaging the measurement data. In determining the maximum particle size of the first inorganic insulating particles 13A, one main surface of the wiring board 3 is polished in the direction of its thickness until one main surface of a first resin layer 14 is exposed, and, part of the resin portion 11 exposed on this exposed surface is removed. Then, the maximum particle size is determined by performing the following steps: observing the exposed surface under a SEM; and measuring the maximum width of the largest particle.

The second inorganic insulating particle 13B has the same function as that of the first inorganic insulating particle 13A, and, for example, is made of the same material as that of the first inorganic insulating particle. The average particle size of the second inorganic insulating particles 13B falls in a range of 0.4 µm or more and 4 µm or less, for example. The maximum particle size of the plurality of second inorganic insulating particles 13B falls in a range of 1.5 µm or more and 8 µm or less, for example. The average particle size and the maximum particle size of the second inorganic insulating particles 13B are determined in the same way as that adopted for the first inorganic insulating particles 13A.

The electrically-conductive layer 8, which is formed partly on the main surface of the base body 7, serves as wiring such as grounding wiring, power supply wiring, or signal wiring. The electrically-conductive layer 8 is made of a metal material such for example as copper, silver, gold, aluminum, nickel, or chromium, and, among them, copper is particularly desirable for use.

The through-hole conductor 9 is formed so as to pass through the base body 7 in the thickness-wise direction, for establishing electrical connection between the paired buildup layers 6 formed on opposed main surfaces of the core substrate 5. The through-hole conductor 9 is made of the same metal material as that used for the electrically-conductive layer 8, for example.

The insulator 10 is intended to support the electrically-conductive layer 8, and is filled inside the through-hole conductor 9 in cylindrical form. The insulator 10 is made of a resin material such for example as polyimide resin or epoxy resin.

(Buildup Layer 6)

The buildup layer 6 includes two or more electrically-conductive layers 8, two or more first resin layers 14, and two or more via-conductors 15. The electrically-conductive layers 8 and the first resin layers 14 are alternately laminated. The via-conductor 15 disposed so as to pass through the first resin layer 14 provides electrical connection between the electrically-conductive layers 8 spaced apart in the thickness-wise direction.

The electrically-conductive layer 8 of the buildup layer 6 is formed partly on the main surface of the first resin layer 14, and has the same function and constitution as those of the electrically-conductive layer 8 of the core substrate 5.

The first resin layer 14 is intended to provide electrical isolation between the electrically-conductive layers 8 spaced apart in the thickness-wise direction, or between the via-conductors 15 spaced apart in a planar direction thereof. The first resin layer 14 comprises the first resin portion 11, and the plurality of first inorganic insulating particles 13A contained in the first resin portion 11. Although the first resin layer 14 of the present embodiment does not include the base material 12, the first resin layer 14 may be designed to include the base material 12.

Moreover, the first resin layer 14 has the first layer region R1 which is in contact with one main surface and side surfaces of the electrically-conductive layer 8, and the second layer region R2 which is located on a side of the first layer region R1 which side is opposite to the electrically-conductive layer 8. That is, the first layer region R1 lies between the second layer region R2 and the electrically-conductive layer 8 while covering the electrically-conductive layer 8. Moreover, the second layer region R2 supports another electrically-conductive layer 8 spaced away from the electrically-conductive layer 8 in the thickness-wise direction.

Moreover, the first layer region R1 comprises the first resin portion 11, and the plurality of first inorganic insulating particles 13A contained in the first resin portion 11. The second layer region R2 comprises the first resin portion 11, and the plurality of second inorganic insulating particles 13B contained in the first resin portion 11.

Figure 3:
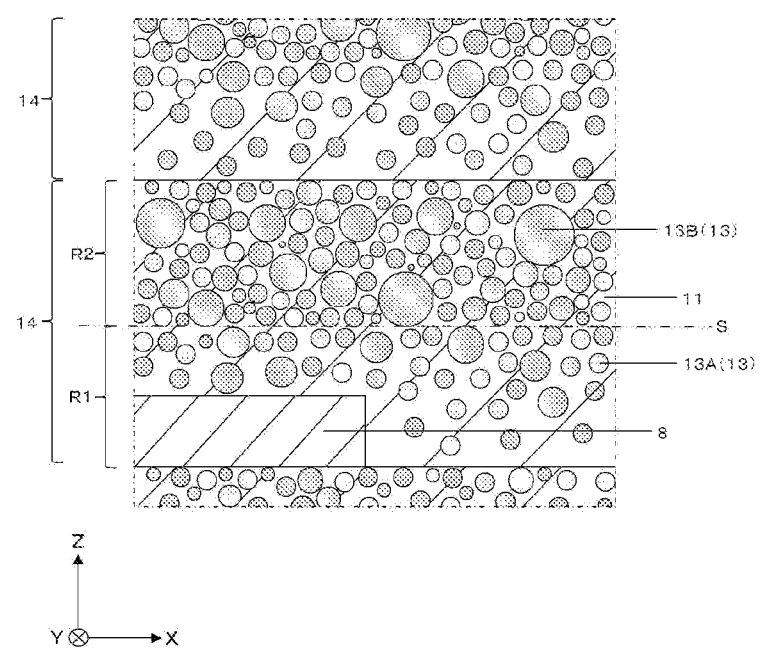
FIG. 3 is an enlarged view of a section A2 of the mounting structure shown in FIG. 1.
Figure 4:
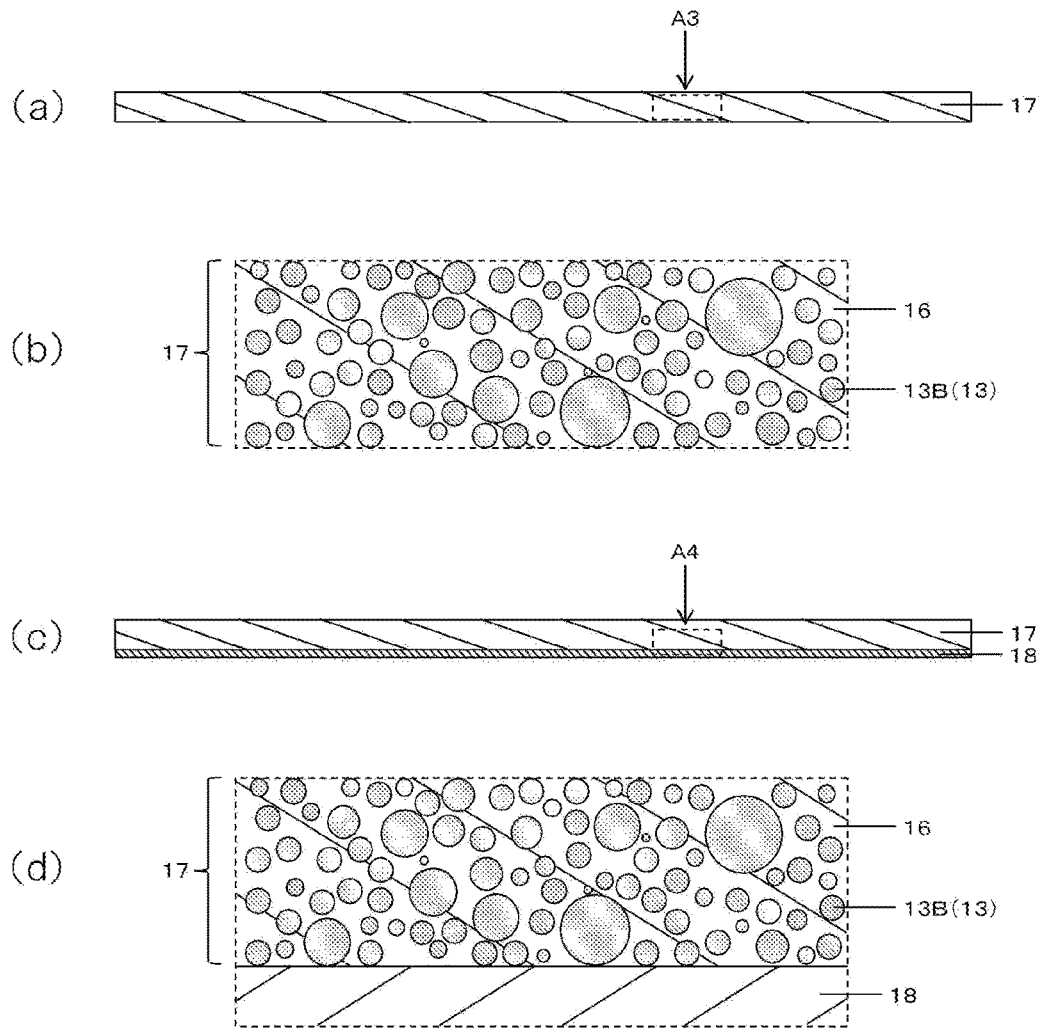
FIGS. 4(a) to 4(d) are sectional views taken along the thickness-wise direction, for explaining process steps to manufacture the mounting structure shown in FIG. 1, and, FIG. 4(b) is an enlarged view of a section A3 as shown in FIG. 4(a)
Figure 5:
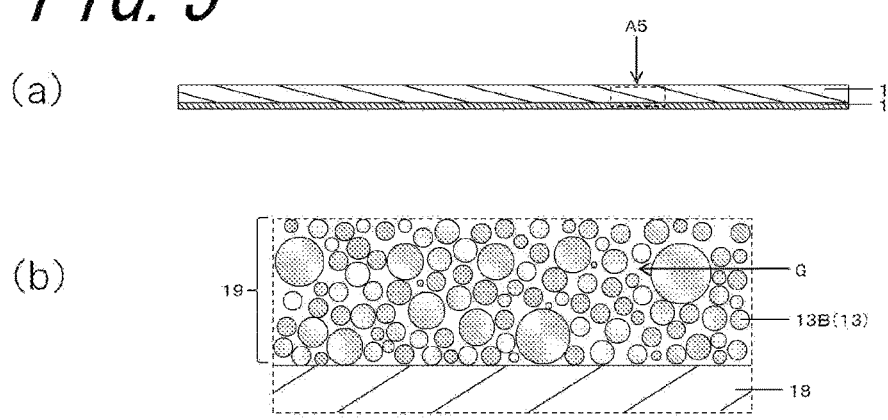
FIGS. 5(a) and 5(b) are sectional views taken along the thickness-wise direction, for explaining process steps to manufacture the mounting structure shown in FIG. 1, and, FIG. 5(b) is an enlarged view of a section A5 as shown in FIG. 5(a)
Figure 6:
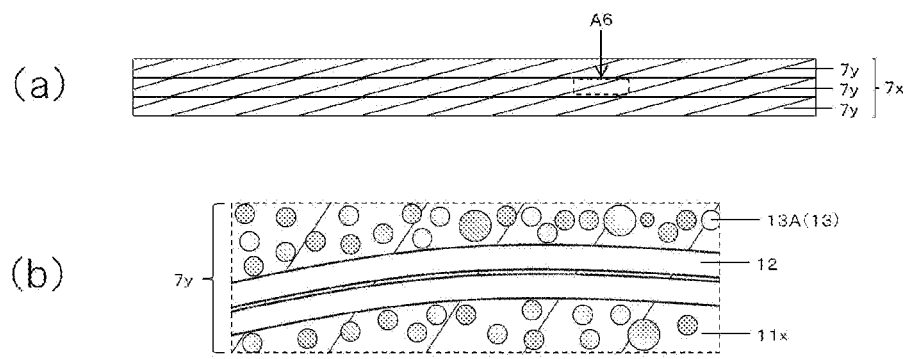
FIGS. 6(a) and 6(b) are sectional views taken along the thickness-wise direction, for explaining process steps to manufacture the mounting structure shown in FIG. 1, and, FIG. 6(b) is an enlarged view of a section A6 as shown in FIG. 6(a)
Figure 7:
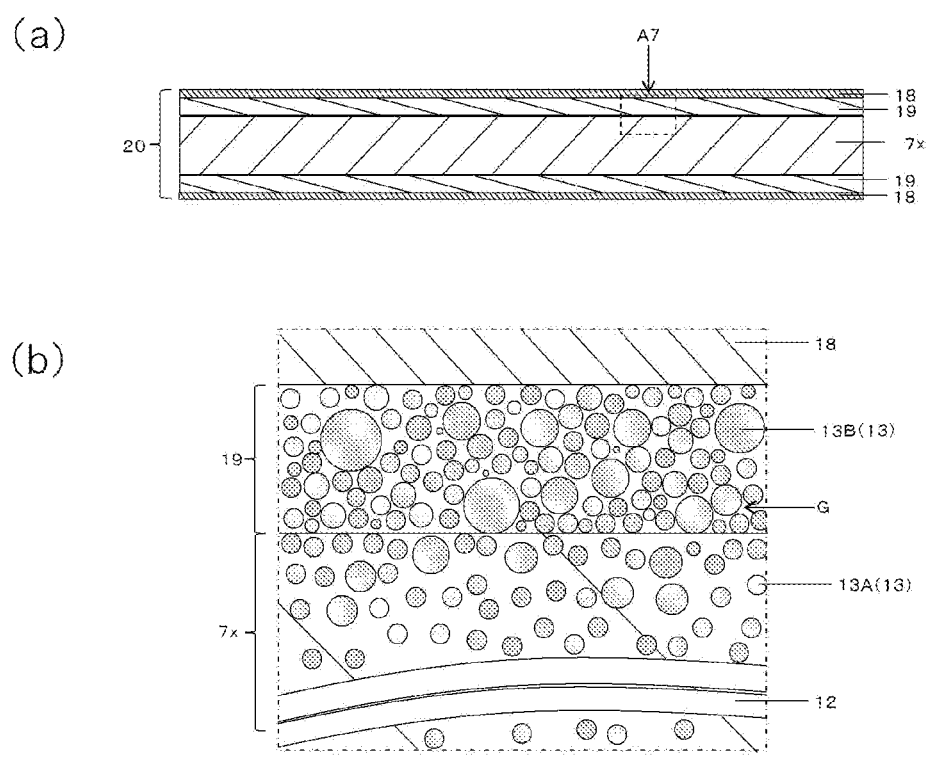
FIGS. 7(a) and 7(b) are sectional views taken along the thickness-wise direction, for explaining process steps to manufacture the mounting structure shown in FIG. 1, and, FIG. 7(b) is an enlarged view of a section A7 as shown in FIG. 7(a)
Figure 8:
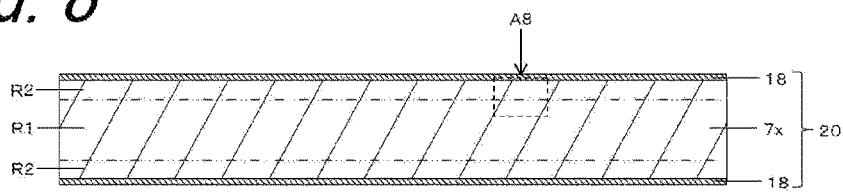
FIGS. 8(a) and 8(b) are sectional views taken along the thickness-wise direction, for explaining process steps to manufacture the mounting structure shown in FIG. 1, and, FIG. 8(b) is an enlarged view of a section A8 as shown in FIG. 8(a)
Figure 8:
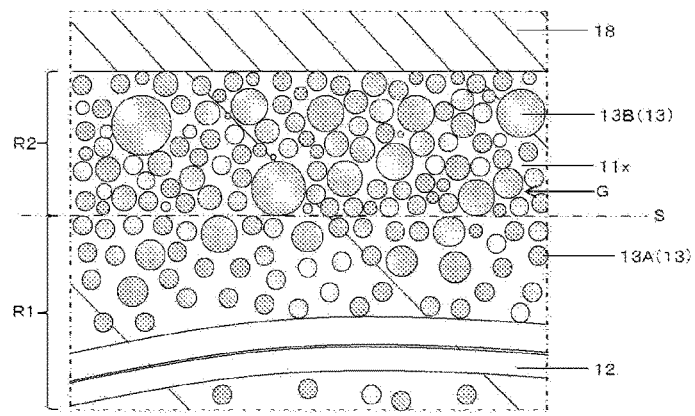
Figure 9:
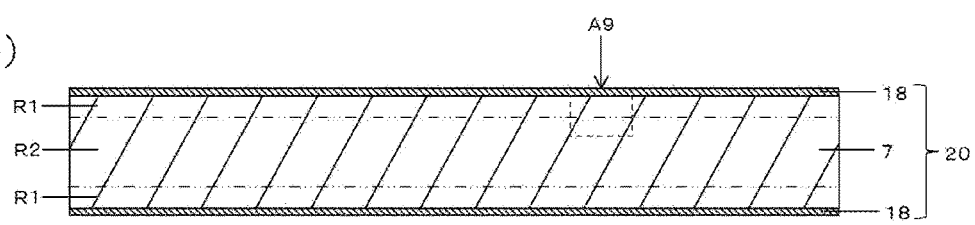
FIGS. 9(a) and 9(b) are sectional views taken along the thickness-wise direction, for explaining process steps to manufacture the mounting structure shown in FIG. 1, and, FIG. 9(b) is an enlarged view of a section A9 as shown in FIG. 9(a)
Figure 9:
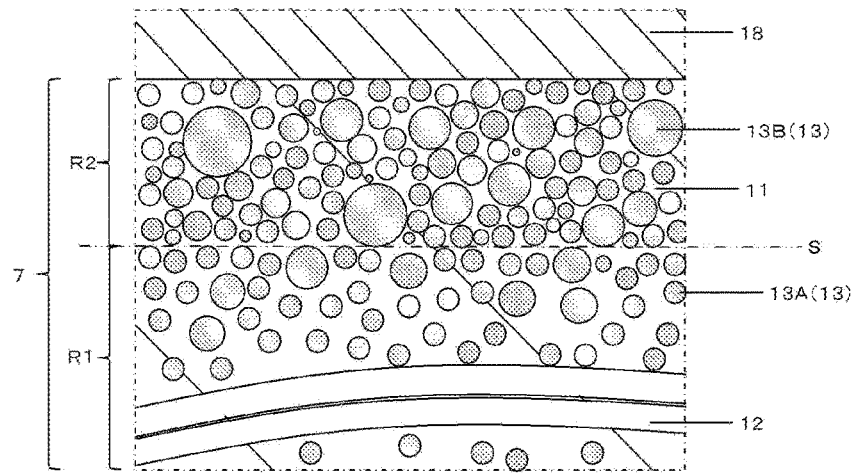
Figure 10:
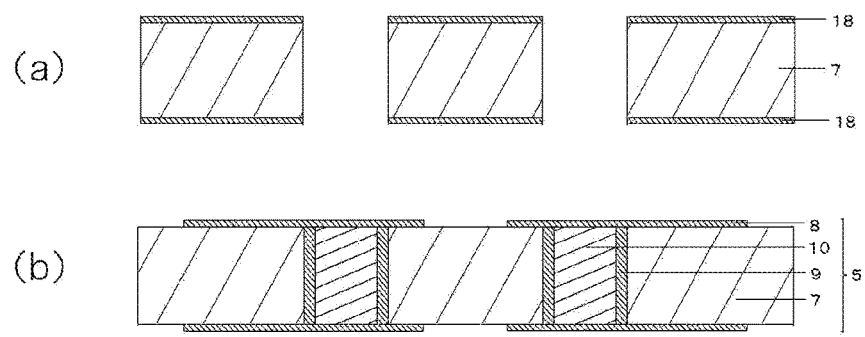
FIGS. 10(a) and 10(b) are sectional views taken along the thickness-wise direction, for explaining process steps to manufacture the mounting structure shown in FIG. 1.
Figure 11:
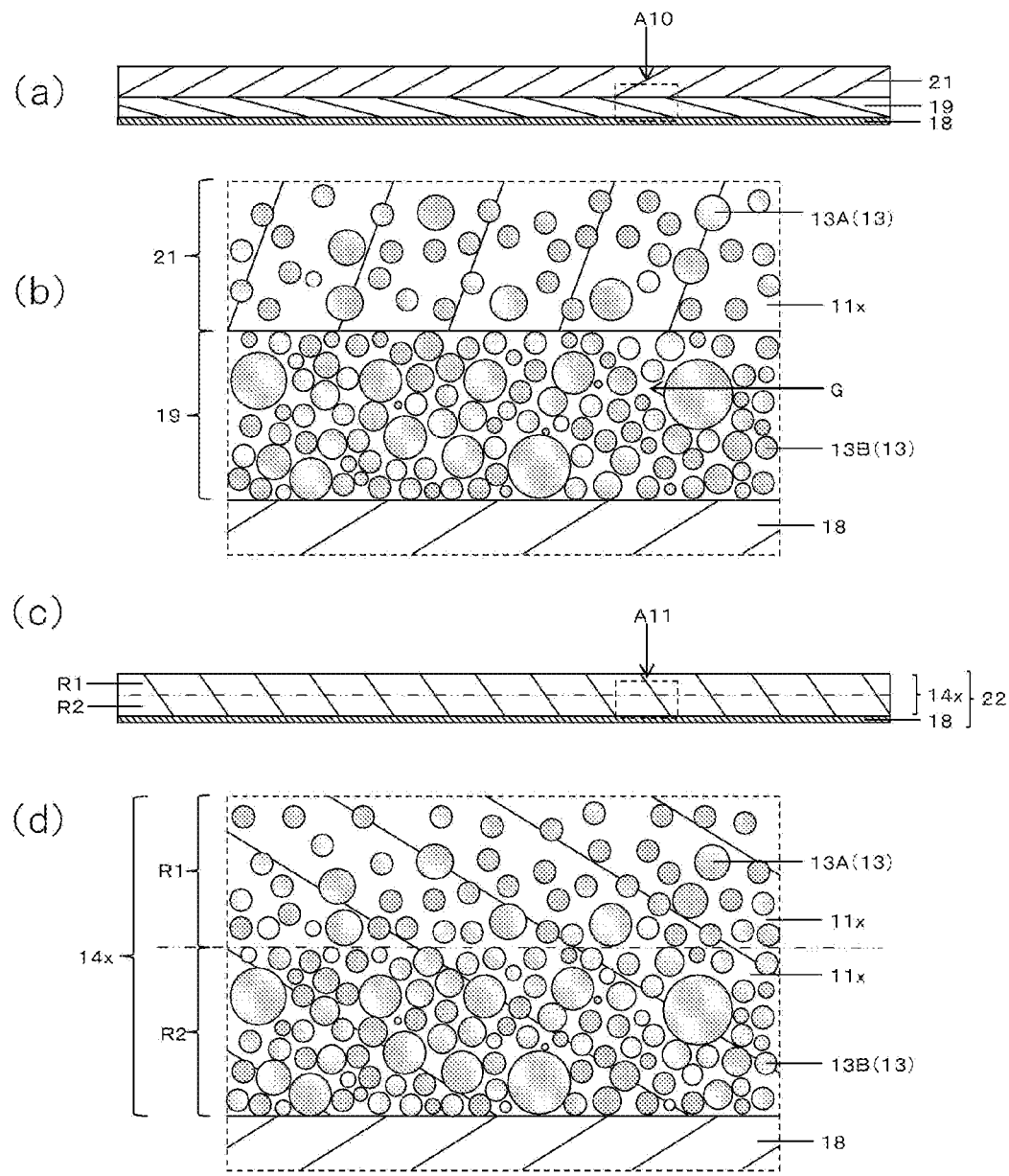
FIGS. 11(a) to 11(d) are sectional views taken along the thickness-wise direction, for explaining process steps to manufacture the mounting structure shown in FIG. 1, and, FIG. 11(b) is an enlarged view of a section A10 as shown in FIG. 11(a)
Figure 12:
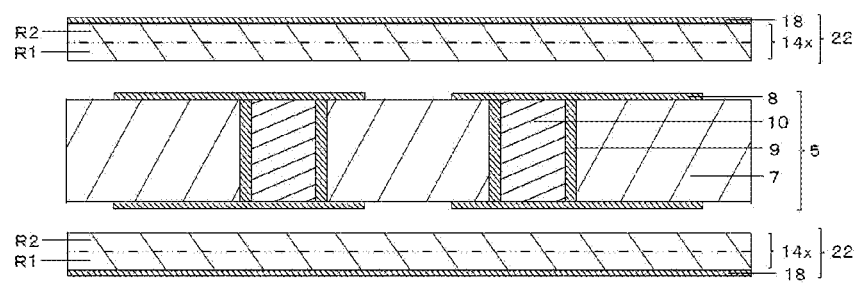
FIGS. 12(a) and 12(b) are sectional views taken along the thickness-wise direction, for explaining process steps to manufacture the mounting structure shown in FIG. 1.
Figure 12:
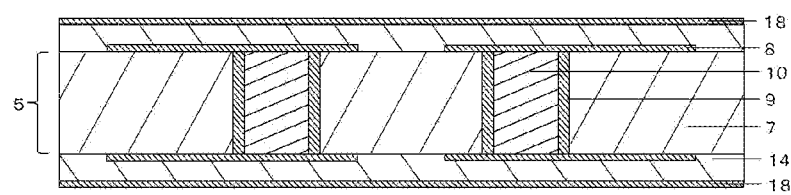
Figure 13:
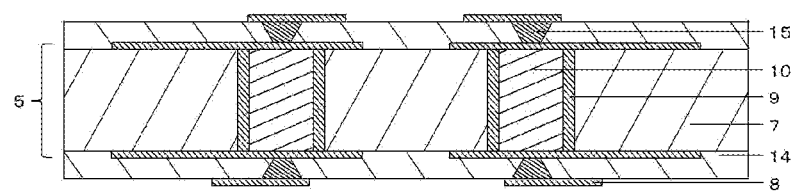
FIGS. 13(a) and 13(b) are sectional views taken along the thickness-wise direction, for explaining process steps to manufacture the mounting structure shown in FIG. 1.
Figure 13:
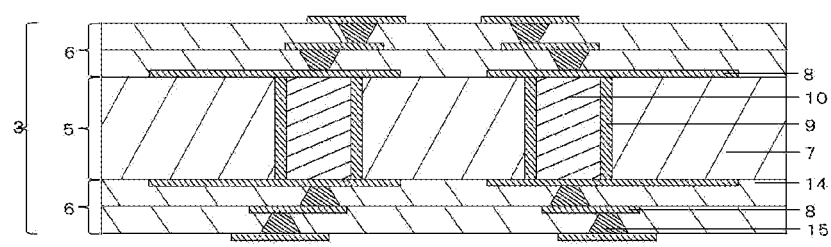

Moreover, as shown in FIG. 3, a boundary surface S in which the first inorganic insulating particles 13A or the second inorganic insulating particles 13B are arrayed may be formed between the first layer region R1 and the second layer region R2 in the first resin layer 14.

The thickness of the first layer region R1 of the first resin layer 14 falls in a range of 5 µm or more and 50 µm or less, for example. Otherwise, the first resin layer 14 has the same constitution as that of the base body 7. Note that the thickness of the first layer region R1 of the first resin layer 14 is determined in the same way as that adopted for the base body 7.

The via-conductor 15 is intended to establish connection between the electrically-conductive layers 8 spaced apart in the thickness-wise direction. The via-conductor 15 has a tapered configuration whose diameter becomes smaller gradually toward the core substrate 5. The via-conductor 15 is made of the same metal material as that used for the electrically-conductive layer 8, for example.

In the first resin layer 14 of the present embodiment, the content rate of the first inorganic insulating particles 13A in the first layer region R1 is lower than the content rate of the second inorganic insulating particles 13B in the second layer region R2.

As a result, in the second layer region R2, since the second inorganic insulating particles 13B made of an inorganic insulating material which is generally smaller in thermal expansion coefficient than a resin material are contained in a larger proportion, it is possible to decrease the thermal expansion coefficient of the second layer region R2. This makes it possible to decrease the thermal expansion coefficient of the first resin layer 14, and thereby reduce the difference in thermal expansion coefficient between the electronic component 2 and the wiring board 3. Accordingly, when the wiring board 3 is subjected to heat, a stress applied between the electronic component 2 and the wiring board 3 can be lessened, wherefore the reliability of connection between the electronic component 2 and the wiring board 3 can be improved.

When the wiring board 3 is subjected to heat, a stress resulting from the difference in thermal expansion coefficient between the electrically-conductive layer 8 and the first resin layer 14 tends to be concentrated on an area in the vicinity of a corner between one main surface and a side surface of the electrically-conductive layer 8 in the first resin layer 14.

In this regard, in the first resin layer 14 of the present embodiment, since the content rate of the first inorganic insulating particles 13A in the first layer region R1 which is in contact with one main surface and side surfaces of the electrically-conductive layer 8 is low, it is possible to achieve further relaxation of a stress applied to the first layer region R1 by the first resin portion 11 which undergoes elastic deformation more readily than the first inorganic insulating particles 13A. Accordingly, in the first layer region R1, occurrence of cracking in the vicinity of the corner of the electrically-conductive layer 8 can be suppressed. This makes it possible to suppress ion migration between the adjacent electrically-conductive layers 8, and thereby improve the electrical reliability of the wiring board 3.

The first resin layer 14 of the present embodiment is composed of a single resin portion 11. This first resin layer 14 is obtained by placing the plurality of inorganic insulating particles 13 in a single resin portion 11, and includes the first layer region R1 and the second layer region R2 that differ from each other in the content rate of the plurality of inorganic insulating particles 13. That is, the first resin layer 14 is not formed into a single resin layer by laminating two layers differing from each other in the content rate of the plurality of inorganic insulating particles 13, but is formed of a single resin layer having two layer regions that differ from each other in the content rate of the plurality of inorganic insulating particles 13.

As a result, since the first resin layer 14 is composed of a single resin portion 11, it is possible to increase the adhesion strength between the first layer region R1 and the second layer region R2. Therefore, even when a thermal stress resulting from the difference in thermal expansion coefficient between the first layer region R1 and the second layer region R2 is applied between the first layer region R1 and the second layer region R2, separation of the first layer region R1 and the second layer region R2 from each other can be suppressed.

In the present embodiment, the content rate of the first inorganic insulating particles 13A in the first layer region R1 becomes lower gradually from the second layer region R2 side toward the electrically-conductive layer 8 side in the thickness-wise direction. As a result, a part of the first layer region R1 which is located on the second layer region R2-side has a higher content rate of the first inorganic insulating particle 13A, with a consequent decrease in thermal expansion coefficient. On the other hand, a part of the first layer region R1 which is located on the electrically-conductive layer 8-side has a lower content rate of the first-inorganic insulating particle 13A, with a consequent suppression of occurrence of cracking.

In the first resin layer 14 of the present embodiment, the average particle size of the plurality of second inorganic insulating particles 13B is greater than the average particle size of the plurality of first inorganic insulating particles 13A. As a result, even when a crack which has appeared in the first layer region R1 reaches the second layer region R2, development of the crack can be suppressed by the second inorganic insulating particles 13B having a greater average particle size.

In the first resin layer 14 of the present embodiment, the standard deviation in particle size of the plurality of second inorganic insulating particles 13B is greater than the standard deviation in particle size of the plurality of first inorganic insulating particles 13A. As a result, the second inorganic insulating particle 13B having a smaller particle diameter finds its way into between the second inorganic insulating particles 13B having a larger particle diameter, wherefore the content rate of the second inorganic insulating particles 13B in the second layer region R2 can be increased. This makes it possible to increase the Young's modulus of the first resin layer 14, as well as to decrease the thermal expansion coefficient of the first resin layer 14.

The level relation in standard deviation between the particle size of the plurality of first inorganic insulating particles 13A and the particle size of the plurality of second inorganic insulating particles 13B is defined in the following manner. To begin with, one main surface of the wiring board 3 is polished in the thickness-wise direction until the first layer region R1 or the second layer region R2 is exposed. Then, at this exposed surface, for example, 10% or and above 90% or below of the thickness of the exposed resin portion 11 of the first layer region R1 or the second layer region R2 is subjected to etching for collection of the inorganic insulating particles 13 of the first layer region R1 or the second layer region R2. Subsequently, the size distribution of the collected inorganic insulating particles 13 is measured by a laser diffraction scattering method, for example. On the basis of the measured values, a comparison is made between the average particle size distribution of the plurality of first inorganic insulating particles 13A and the average particle size distribution of the plurality of second inorganic insulating particles 13B, whereby the level relation in standard deviation between the particle size of the plurality of first inorganic insulating particles 13A and the particle size of the plurality of second inorganic insulating particles 13B can be defined.

In the first resin layer 14 of the present embodiment, the plurality of second inorganic insulating particles 13B are in contact with one another. As a result, the content rate of the plurality of second inorganic insulating particles 13B in the second layer region R2 can be increased, wherefore the thermal expansion coefficient of the second layer region R2 can be decreased.

In the first resin layer 14 of the present embodiment, the plurality of first inorganic insulating particles 13A are spaced away from one another. As a result, the content rate of the resin portion 11 in the first layer region R1 can be increased, wherefore occurrence of cracking in the first resin layer 14 can be suppressed.

In order to identify the mutual contact of the first inorganic insulating particles 13A, as well as the mutual contact of the second inorganic insulating particles 13B, at the section of the wiring board 3 taken along the thickness-wise direction (Z direction), part of the resin portion 11 exposed at the section is removed, and a section in which part of the resin portion is removed is observed under a SEM.

In the first resin layer 14 of the present embodiment, the maximum particle size of the plurality of second inorganic insulating particles 13B is greater than the maximum particle size of the plurality of first inorganic insulating particles 13A. As a result, the Young's modulus of the second layer region R2 can be adjusted to be higher than the Young's modulus of the first layer region R1 satisfactorily. By imparting higher Young's modulus to the second layer region R2 located outwardly of the wiring board 3 beyond the first layer region R1, it is possible to restrain the wiring board 3 against warpage.

In the first resin layer 14 of the present embodiment, the first inorganic insulating particle 13A and the second inorganic insulating particle 13B are made of the same material.

As a result, the material characteristics of the first layer region R1 closely approximate the material characteristics of the second layer region R2, wherefore a stress applied to the boundary surface S between the first layer region R1 and the second layer region R2 can be lessened. This makes it possible to suppress separation of the first layer region R1 and the second layer region R2 from each other, and thereby suppress occurrence of cracking in the first resin layer 14.

Meanwhile, in the base body 7 of the present embodiment, the content rate of the first inorganic insulating particles 13A in the first layer region R1 is lower than the content rate of the second inorganic insulating particles 13B in the second layer region R2.

As the result of decreasing the content rate of the first inorganic insulating particles 13A in the first layer region R1, it is possible to increase the adhesion area between the resin portion 11 and the base material 12, and thereby increase the adhesion strength between the resin portion 11 and the base material 12. Accordingly, separation of the resin portion 11 from the base material 12 can be suppressed, wherefore ion migration between the through-hole conductors 9 resulting from the separation can be suppressed.

Moreover, by increasing the content rate of the second inorganic insulating particles 13B in the second layer region R2, it is possible to decrease the thermal expansion coefficient of the second layer region R2. Accordingly, the thermal expansion coefficient of the base body 7 in the planar direction can be decreased, with a consequent reduction of the difference in thermal expansion coefficient between the electronic component 2 and the wiring board 3.

Moreover, since the paired second layer regions R2 are located on opposed main surfaces of the base body 7, respectively, it is possible to reduce the difference in thermal expansion coefficient between the main surfaces of the base body 7, and thereby suppress warpage of the base body 7 resulting from thermal expansion. Accordingly, improper installation of the electronic component 2 on the wiring board 3 can be suppressed. Also, the reliability of connection between the wiring board 3 and the electronic component 2 can be improved.

The first inorganic insulating particle 13A and the second inorganic insulating particle 13B of the base body 7 may have the same constitution to the first inorganic insulating particle 13A and the second inorganic insulating particle 13B of the first resin layer 14.

(Method for Manufacturing Mounting Structure)

Next, a method for manufacturing the above-described mounting structure 1 will be described with reference to FIGS. 4 to 13.

(1) As shown in FIGS. 4(a) and 4(b), a sol 17 composed of a solvent 16 and a plurality of second inorganic insulating particles 13B dispersed in the solvent 16 is prepared. For example, the sol 17 contains 7% by volume or above and 50% by volume or below of the second inorganic insulating particle 13B, and contains 50% by volume or above or 93% by volume or below of a solvent 16.

As the solvent 16 contained in the sol 17, for example, an organic solvent containing methanol, isopropanol, methyl isobutyl ketone, or methyl ethyl ketone can be used. As a result, in the sol 17, the solvent 16 exhibits good wettability to the plurality of second inorganic insulating particles 13B, which makes it possible to restrain the second inorganic insulating particles 13B against agglomeration, and thereby disperse the plurality of second inorganic insulating particles 13B in the solvent 16 satisfactorily. Note that an organic solvent of other type, or water can also be used for the solvent 16.

(2) As shown in FIGS. 4(c) and 4(d), a support sheet 18 is prepared, and, the sol 17 is applied in layer form to one main surface of the support sheet 18.

As the support sheet 18, a resin film containing polyethylene, polyethylene terephthalate, polyethylene naphthalate, or the like, or metal foil containing copper or the like can be used. For example, a dispenser, a bar coater, a doctor blade, a die coater, or a screen printing technique can be used for the application of the sol 17.

(3) As shown in FIGS. 5(a) and 5(b), the solvent 16 is evaporated from the sol 17 applied to the main surface of the support sheet 18 in order to let the sol 17 dry. Thus, the plurality of second inorganic insulating particles 13B remain on the main surface of the support sheet 18. As a result, a powder layer 19 can be created on the main surface of the support sheet 18. The powder layer 19 comprises the plurality of second inorganic insulating particles 13B that are three-dimensionally in partial contact with one another, and a gap G existing between the plurality of second inorganic insulating particles 13B. The gap G is an open pore opened toward a main surface of the powder layer 19 which is opposite to the support sheet 18.

Although FIG. 5(b) is a sectional view showing the section of the powder layer 19 taken along the thickness-wise direction, contact points of the plural second inorganic insulating particles 13B are not necessarily observed at the section of the powder layer 19, because the second inorganic insulating particles 13B are three-dimensionally in contact with one another in part.

In the preparation of the sol 17 in the process step (1), the plurality of second inorganic insulating particles 13B are dispersed in the solvent 16 satisfactorily, and are thus restrained against agglomeration, wherefore, it is possible to minimize unevenness in the thickness of the powder layer 19 upon the evaporation of the solvent 16 in this step. As a result, the first resin layer 14 can be made to have a uniform thickness in its entirety.

The sol 17 is dried by means of heat application or air-drying, for example. Moreover, the time to dry the sol 17 falls in a range of 20 seconds or longer and 30 minutes or shorter, for example. In addition, the drying temperature of the sol 17 is, for example, higher than or equal to 20° C., but lower than the boiling point of the solvent 16 (when the solvent 16 is composed of a mixture of two or more different solvent 16 portions, the boiling point of the solvent portion having the lowest boiling point is adopted).

(4) As shown in FIGS. 6(a) and 6(b), a base body precursor 7x including one or two or more resin base layers 7y containing an uncured first resin 11x, a base material 12 covered with the uncured first resin 11x, and a plurality of first inorganic insulating particles 13A dispersed in the uncured first resin 11x, is prepared. Then, as shown in FIGS. 7(a) to 8(b), the powder layer 19 is laminated on each of opposed main surfaces of the base body precursor 7x, and, the uncured first resin 11x of the base body precursor 7x is, at least partly, filled into the gap G of the powder layer 19.

Specifically, as shown in FIGS. 7(a) and 7(b), the support sheet 18, the powder layer 19, and the base body precursor 7x are laminated together while the main surface of the powder layer 19 which is opposite to the support sheet 18 is kept in contact with the main surface of the base body precursor 7x. In this way, a stacked body 20 comprising the support sheet 18, the powder layer 19, and the base body precursor 7x can be formed.

Then, as shown in FIGS. 8(a) and 8(b), the stacked body 20 is pressurized in the thickness-wise direction while being heated at a lower temperature than the curing start temperature at of the uncured first resin 11x. Thus, the thermally-softened uncured first resin 11x is fluidized, so that the uncured first resin 11x is, at least partly, filled into the gap G of the powder layer 19.

In this step, the heating temperature of the first resin 11x falls in a range of 65° C. or higher and 150° C. or lower, for example. The pressure to be applied to the first resin 11x falls in a range of 0.2 MPa or more and 3 MPa or less, for example.

(5) As shown in FIGS. 9(a) and 9(b), the stacked body 20 is pressurized in the thickness-wise direction while being heated at a temperature which is higher than or equal to the curing start temperature of the uncured first resin 11x, but lower than the pyrolysis temperature thereof. Thus, the uncured first resin 11x is thermally cured, whereupon a first resin portion 11 can be obtained. As a result, it is possible to form a base body 7 having a first layer region R1 and paired second layer regions R2 located on opposed main surfaces of the first layer region R1, respectively. The first layer region R1 comprises: the first resin portion 11; a base material 12 covered with the first resin portion 11; and the plurality of first inorganic insulating particles 13A contained in the first resin portion 11. The second layer region R2 comprises: the first resin portion 11; and the plurality of second inorganic insulating particles 13B contained in the first resin portion 11.

In this step, the heating temperature of the first resin 11x falls in a range of 160° C. or higher and 240° C. or lower, for example. The pressure to be applied to the first resin 11x falls in a range of 0.2 MPa or more and 3 MPa or less, for example.

In the process of formation of the base body, there may be a case where a mixture of an uncured resin and a plurality of inorganic insulating particles is shaped like a layer with use of a doctor blade, for example. In this case, if the content rate of the inorganic insulating particles is increased, the fluidity of the mixture will be decreased. In consequence, the shaping of the mixture into a layer tends to end in failure.

In this regard, in the present embodiment, in the process of formation of the base body 7, following the creation of the powder layer 19 on the support sheet 18, the powder layer 19 is placed on each of the main surfaces of the base body precursor 7x, and the uncured first resin 11x is filled into the gap G of the powder layer 19. As a result, the process of shaping a mixture into a layer becomes unnecessary, wherefore the base body 7 having a higher content rate of the inorganic insulating particle 13 can be formed with a high yield.

Moreover, since the content rate of the inorganic insulating particles 13 in the base body 7 is increased due to the powder layer 19, it is possible to decrease the content rate of the first inorganic insulating particles 13A in the base body precursor 7x. As a result, air bubbles existing around the base material 12 in the base body precursor 7x can be reduced.

(6) As shown in FIG. 10(b), paired electrically-conductive layers 8 located on opposed main surfaces of the base body 7, respectively, and also a cylindrical through-hole conductor 9 disposed so as to pass through the base body 7 for establishing electrical connection between the paired electrically-conductive layers 8 are formed. Specifically, the formation is carried out as follows.

As a first step, as shown in FIG. 10(a), a plurality of through holes are formed in the base body 7 so as to pass through the support sheet 18 and the base body 7 in the thickness-wise direction by means of drilling or lasering, for example. Next, as shown in FIG. 10(b), after the support sheet 18 is removed mechanically or chemically, a cylindrical through-hole conductor 9 is formed by means of electroless plating or electroplating, for example. Next, an insulator 10 is formed inside the cylindrical through-hole conductor 9. Next, an electrically-conductive layer 8 having a desired shape is formed by, for example, a semi-additive method or subtractive method using the electroless plating technique or electroplating technique.

(7) As shown in FIGS. 11(a) to 11(d), an uncured first resin 11x and a powder layer 19 which is formed by performing a process step similar to the process step (3) are prepared, and, the uncured first resin 11x is, at least partly, filled into the gap G of the powder layer 19. As a result, a first resin layer precursor 14x comprising the powder layer 19 and the uncured first resin 11x filled in the gap G of the powder layer 19 is formed.

In the present embodiment, the process of formation of the first resin layer precursor 14x, following the creation of the inorganic powder layer 19 on the support sheet 18, the uncured first resin 11x is filled into the gap G of the inorganic powder layer 19. This makes it possible to eliminate the need for the process of shaping a mixture into a layer, and thereby produce the first resin layer precursor 14x having a high content rate of the plurality of second inorganic insulating particles 13B with a high yield.

The uncured first resin 11x is preferably epoxy resin from the viewpoint of its wettability to the second inorganic insulating particle 13B. Moreover, a surface of the second inorganic insulating particle 13B is preferably coated with a silane-based coupling agent, such for example as 3-aminopropyltrimethoxysilane, 3-glycidoxypropyltrimethoxysilane, allyltrimethoxysilane, or 3-acryloxypropyltrimethoxysilane, from the viewpoint of its wettability to the uncured first resin 11x.

Moreover, the gap G of the powder layer 19 is surrounded with the plurality of second inorganic insulating particles 13B. Since the average particle size of the second inorganic insulating particles 13B falls in the range of 0.4 µm or more and 4 µm or less, it is possible to suppress that the gap G of the powder layer 19 becomes unduly small. Accordingly, the efficiency of filling the uncured first resin 11x into the gap G of the powder layer 19 can be enhanced.

Moreover, the uncured first resin 11x takes on the form of a sheet, for example. As a result, the thickness of the first resin layer precursor 14x can be adjusted with great precision, wherefore the signal characteristics of the electrically-conductive layer 8 can be improved. For example, the sheet-shaped uncured first resin 11x is in a state of the B-stage pursuant to ISO 472: 1999.

In this case, the filling of the first resin 11x is carried out as follows, for example. To begin with, the sheet-shaped uncured first resin 11x is laminated on the main surface of the powder layer 19 which is opposite to the support sheet 18, by means of, for example, vacuum laminator or otherwise. Next, the support sheet 18, the powder layer 19, and the first resin 11x are pressurized in the thickness-wise direction while being heated at a lower temperature than the curing start temperature of the first resin 11x. In this way, the first resin 11x can be filled into the gap G of the powder layer 19. The above heating and pressurizing conditions are the same as those adopted in the process step (4), for example.

Moreover, the uncured first resin 11x may alternatively have the form of a liquid. As a result, the viscosity of the first resin 11x is decreased, wherefore the efficiency of filling the first resin 11x into the gap G of the powder layer 19 can be enhanced. For example, the liquid-shaped uncured first resin 11x is in a state of the A-stage pursuant to ISO 472: 1999.

In this case, the filling of the first resin 11x is carried out as follows, for example. To begin with, the liquid-shaped uncured first resin 11x is applied to the main surface of the powder layer 19 which is opposite to the support sheet 18, for the impregnation of the gap G of the powder layer 19 with the first resin 11x. Next, the support sheet 18, the powder layer 19, and the first resin 11x are heated at a temperature in a range of 65° C. or higher and 150° C. or lower, for example. This helps facilitate the curing of the first resin 11x, and eventually brings the first resin 11x into the state of the B-stage. As a result, the first resin layer precursor 14x can be formed.

In the present embodiment, as shown in FIGS. 11(a) to 11(d), a part of the uncured first resin 11x remains on the main surface of the powder layer 19, whereas the other part of the uncured first resin 11x is filled in the gap G of the powder layer 19. In this case, the first resin layer precursor 14x has a second layer region R2 which includes the uncured first resin 11x and the plurality of second inorganic insulating particles 13B, and a first layer region R1 which includes the uncured first resin 11x, but is devoid of the plurality of second inorganic insulating particles 13B. As a result, as can be seen from a process step (8) which will hereafter be described, yield improvement can be achieved in the process of lamination of the first resin layer precursor 14.

In the present embodiment, as shown in FIGS. 11(a) and 11(b), on the main surface of the powder layer 19 is applied a mixture 21 of the uncured first resin 11x and the plurality of first inorganic insulating particles 13A dispersed in the uncured first resin 11x. Moreover, as shown in FIGS. 11(c) and 11(d), the uncured first resin 11x constituting the mixture 21 is filled into the gap G of the powder layer 19. The thus formed first layer region R1 of the first resin layer precursor 14x includes the plurality of first inorganic insulating particles 13A dispersed in the uncured first resin 11x. As a result, the content rate of the plurality of inorganic insulating particles 13 in the first resin layer precursor 14x can be increased.

In the present embodiment, as shown in FIG. 11(d), the content rate of the first inorganic insulating particles 13A in the first layer region R1 is easily set to be lower than the content rate of the second inorganic insulating particles 13B in the second layer region R2 simply by making adjustment to the amounts of the first inorganic insulating particles 13A and the second inorganic insulating particles 13B to be contained.

In the present embodiment, as shown in FIG. 11(d), at the time of filling the uncured first resin 11x into the gap G of the powder layer 19, between the plurality of first inorganic insulating particles 13A, some do not find their way into the gap G of the powder layer 19, but accumulate on one main surface of the powder layer 19. As a result, the content rate of the first inorganic insulating particles 13A in the first layer region R1 becomes lower gradually from the second layer region R2-side toward the side opposite to the second layer region R2 in the thickness-wise direction. This makes it possible to achieve yield improvement in the process of lamination of the first resin layer precursor 14.

In the present embodiment, the average particle size of the first inorganic insulating particles 13A is greater than the width of the gap G. As a result, the first inorganic insulating particles 13A are less prone to entry into the gap G of the powder layer 19. This makes it possible to enhance the efficiency of filling the uncured first resin 11x into the gap G of the powder layer 19.

(8) As shown in FIG. 12(a), a laminate sheet 22 is laminated on each of opposed main surfaces of a core substrate 5 in such a manner that the first resin layer precursor 14x covers an electrically-conductive layer 8 of the core substrate 5. Next, the laminate sheet 22 is pressurized in the thickness-wise direction while being heated at a temperature which is higher than or equal to the curing start temperature of the uncured first resin 11x but lower than the pyrolysis temperature thereof, so that the uncured first resin 11x is thermally cured into a first resin portion 11. As a result, as shown in FIG. 12(b), the first resin layer precursor 14x becomes a first resin layer 14. The heating and pressurizing conditions set for the laminate sheet 22 are the same as those adopted in the process step (5), for example.

In the process step (7), by setting the content rate of the plurality of first inorganic insulating particles 13A in the first layer region R1 to be lower than the content rate of the second inorganic insulating particles 13S in the second layer region R2, it is possible to suppress generation of air bubbles in the vicinity of the electrically-conductive layer 8 of the first resin layer precursor 14x during the lamination of the first resin layer precursor 14.

(9) As shown in FIG. 13(a), a via-conductor 15 is formed so as to pass through the first resin layer 14 in the thickness-wise direction, and, an electrically-conductive layer 8 is formed on the main surface of the first resin layer 14. Specifically, to begin with, a via-hole is created in the support sheet 18 and the first resin layer 14 by means of lasering, for example, so that the electrically-conductive layer 8 is, at least partly, exposed at the bottom of the via-hole. Next, after the support sheet 18 is removed mechanically or chemically, for example, with the semi-additive method or the subtractive method, the via-conductor 15 is formed in the via-hole, and, the electrically-conductive layer 8 is formed on the main surface of the first resin layer 14.

(10) With a repetition of the process steps (7) to (9), as shown in FIG. 13(b), a buildup layer 6 is formed on each of opposed main surfaces of the core substrate 5.

In the manner thus far described, a wiring board 3 comprising the core substrate 5 and the buildup layers 6 disposed on opposed main surfaces of the core substrate 5 is fabricated.

(11) An electronic component 2 is flip-chip mounted on one main surface of the wiring board 3, whereupon a mounting structure 1 as shown in FIG. 1 can be produced.

Second Embodiment (Mounting Structure)

Next, a mounting structure equipped with a wiring board in accordance with the second embodiment of the invention will be particularized with reference to drawings. Note that its constitutional similarities to the foregoing first embodiment will be omitted from the following description.

Figure 14:
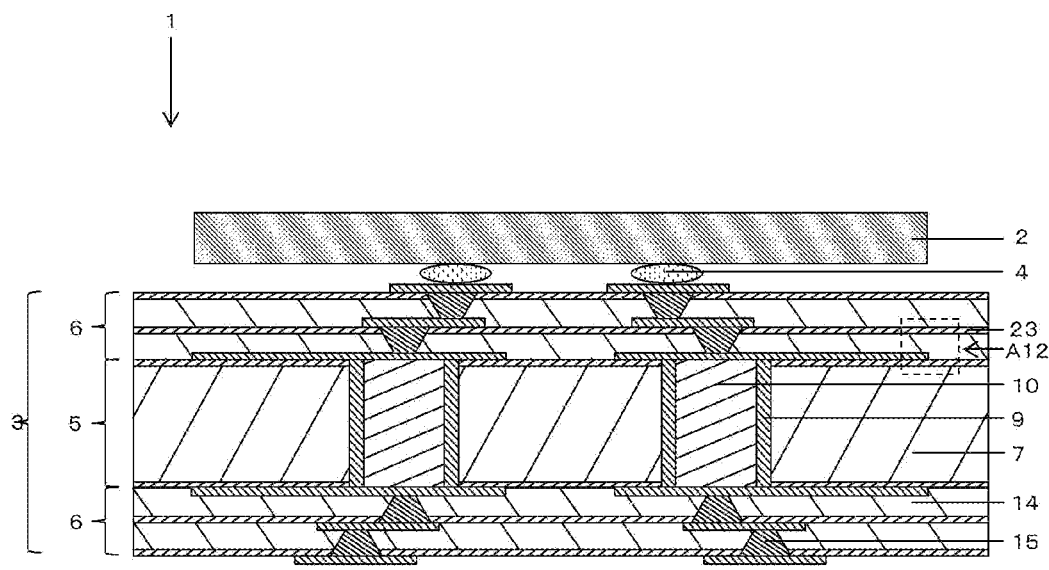
FIG. 14 is a sectional view of a mounting structure in accordance with a second embodiment of the invention taken along a thickness-wise direction thereof.
Figure 15:
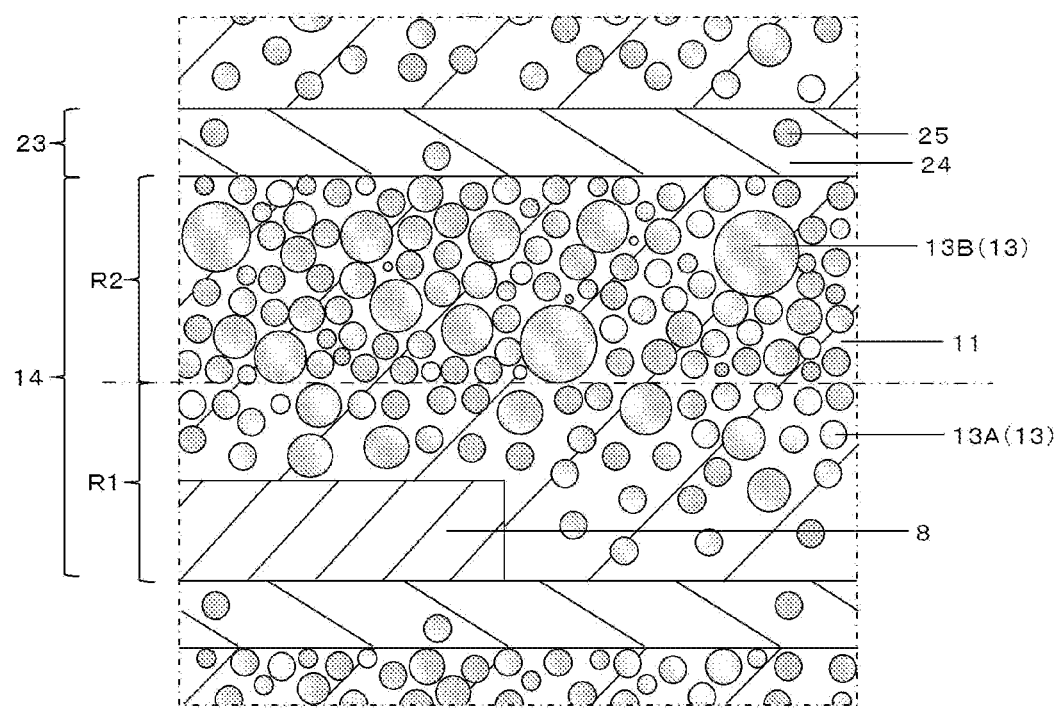
FIG. 15 is an enlarged view of a section A12 of the mounting structure shown in FIG. 14.

As shown in FIGS. 14 and 15, the wiring board 3 of the second embodiment differs from the wiring board of the first embodiment in that it has a second resin layer 23 attached to the core substrate 5 or the buildup layer 6. The second resin layer 23 of the core substrate 5 is placed on one main surface of the base body 7 so as to lie between the base body 7 and the electrically-conductive layer 8. The second resin layer 23 of the buildup layer 6 is placed on one main surface on the second layer region R2-side of the first resin layer 14 so as to lie between the first resin layer 14 and the electrically-conductive layer 8. Hereinafter, the second resin layer 23 of the buildup layer 6 will be described. Note that the second resin layer 23 of the core substrate 5 has the same constitution and function as those of the second resin layer 23 of the buildup layer 6.

The second resin layer 23 has the capability of lessening a thermal stress applied between the first resin layer 14 and the electrically-conductive layer 8, and also the capability of suppressing a break in the electrically-conductive layer 8 originating from a crack developed in the first layer region R1 of the first resin layer 14. The second resin layer 23 is in contact with one main surfaces of, respectively, the first resin layer 14 and the electrically-conductive layer 8. Moreover, the second resin layer 23 comprises a second resin portion 24 and third inorganic insulating particles 25 dispersed in the second resin portion 24.

The thickness of the second resin layer 23 falls in a range of 0.1 μm or more and 5 μm or less, for example. The Young's modulus of the second resin layer 23 falls in s range of 0.05 GPa or more and 5 GPa or less, for example. The thermal expansion coefficient of the second resin layer 23 in the planar direction, as well as in the thickness-wise direction falls in a range of 20 ppm/° C. or more and 100 ppm/° C. or less, for example.

The second resin portion 24, which constitutes the main part of the second resin layer 23, is made of a resin material such for example as epoxy resin, bismaleimide triazine resin, cyanate resin, or polyimide resin.

The third inorganic insulating particle 25 has the capability of enhancing the fire retardancy of the second resin layer 23. The third inorganic insulating particle 25 is made of an inorganic insulating material such for example as silicon oxide. The average particle size of the third inorganic insulating particles 25 falls in a range of 0.05 μm or more and 0.7 μm or less, for example. The content rate of the third inorganic insulating particles 25 in the second resin layer 23 falls in a range of 1% by volume or above and 10% by volume or below, for example.

In this embodiment, the Young's modulus of the second resin layer 23 is lower than the Young's modulus of the first resin layer 14. Moreover, the thickness of the second resin layer 23 is smaller than the thickness of the first resin layer 14. As a result, by virtue of the second resin layer 23 which is made thin and thus readily elastically deformable, a thermal stress resulting from the difference in thermal expansion coefficient between the first resin layer 14 and the electrically-conductive layer 8 can be reduced. Note that the Young's moduli of the first resin layer 14 and the second resin layer 23 are determined by a measurement method in compliance with ISO 527-1: 1993 using a nano indenter.

In the present embodiment, the content rate of the third inorganic insulating particles 25 in the second resin layer 23 is lower than the content rate of the inorganic insulating particles 13 in the first resin layer 14. Accordingly, the Young's modulus of the second resin layer 23 can be set to be lower than the Young's modulus of the first resin layer 14.

In the present embodiment, the average particle size of the third inorganic insulating particles 25 is smaller than the average particle size of the inorganic insulating particles 13. Accordingly, the Young's modulus of the second resin layer 23 can be set to be lower than the Young's modulus of the first resin layer 14.

(Method for Manufacturing Mounting Structure)

Next, a method for manufacturing the above-described mounting structure 1 of the second embodiment will be described. Note that procedures similar to those related to the foregoing first embodiment will be omitted from the following description.

Figure 16:
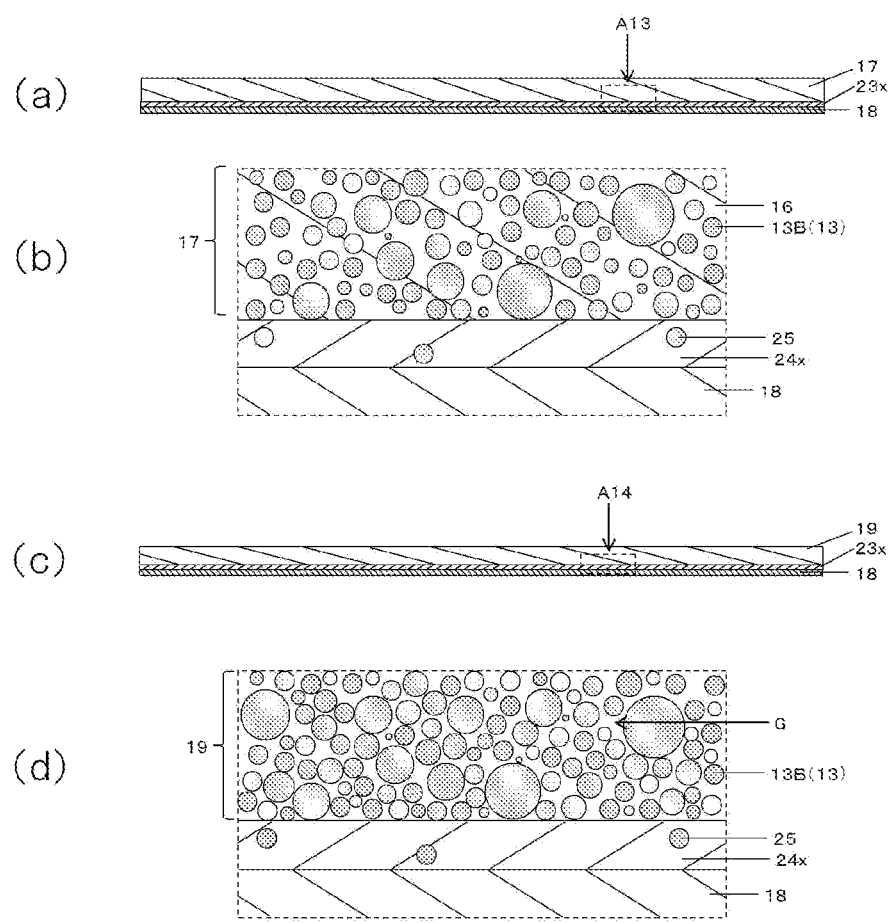
FIGS. 16(a) to 16(d) are sectional views taken along the thickness-wise direction, for explaining process steps to manufacture the mounting structure shown in FIG. 14, and, FIG. 16(b) is an enlarged view of a section A13 as shown in FIG. 16(a)

As a process step similar to the process step (2) related to the first embodiment, as shown in FIGS. 16(a) and 16(b), after a second resin layer precursor 23x, which includes an uncured second resin 24x and the third inorganic insulating particles 25, is applied or laminated onto the support sheet 18, a sol 17 is applied to a main surface of the uncured second resin 24x which is opposite to the support sheet 18. Next, as a process step similar to the process step (3), as shown in FIGS. 16(c) and 16(d), as the support sheet 18, the sol 17, and the second resin layer precursor 23x are heated at a lower temperature than the curing start temperature of the uncured second resin 24x, the sol 17 is dried, whereupon a powder layer 19 is formed. Next, as a process step similar to the process step (8), while the uncured first resin 11x is being thermally cured, the uncured second resin 24x is also thermally cured simultaneously, thereby forming a second resin layer 23.

Since the powder layer 19 is formed on the main surface of the second resin layer precursor 23x, it is possible for the second resin layer precursor 23x to increase the adhesion strength between the support sheet 18 and the powder layer 19. Accordingly, the wiring-board 3 production efficiency can be enhanced.

Moreover, it is desirable to use an organic solvent for the solvent 16 constituting the sol 17. As a result, when the sol 17 is applied to the main surface of the second resin layer precursor 23x, the surface of a side of the second resin layer precursor 23x on the sol 17-side can be softened, wherefore the adhesion strength between the support sheet 18 and the powder layer 19 can be increased even further.

It should be understood that the application of the invention is not limited to the embodiments described heretofore, and that various changes, modifications, and combinations are possible without departing from the scope of the invention.

Moreover, although, in the embodiments of the invention thus far described, the wiring board 3 is provided with the buildup layers 6 located on opposed main surfaces of the core substrate 5, respectively, the wiring board 3 may be a board composed solely of the buildup layers 6, or equivalently a coreless board, or may be a board composed solely of the core substrate 5.

Moreover, although, in the above-described embodiments of the invention, the second resin layer 23 includes the third inorganic insulating particles 25, the second resin layer 23 may not include the third inorganic insulating particles 25.

Moreover, although, in the above-described embodiments of the invention, the first resin layer 14 has the first layer region R1, the first resin layer 14 may not have the first layer region R1. In this case, the Young's modulus of the first resin layer 14 can be increased. A first layer region R1-free first resin layer 14 can be formed by filling the entire uncured first resin 11x into the gap G of the powder layer 19.

Moreover, although, in the above-described embodiments of the invention, both of the base body 7 and the first resin layer 14 have the second layer region R2, only one of the base body 7 and the first resin layer 14 may have the second layer region R2.

Moreover, although, in the above-described embodiments of the invention, the plurality of second inorganic insulating particles 13B are in contact with one another, the plurality of second inorganic insulating particles 13B may be spaced apart from each other.

Moreover, although, in the above-described manufacturing methods in accordance with the embodiments of the invention, the uncured second resin 24x and the uncured first resin 11x are thermally cured at the same time, the uncured second resin 24x and the uncured first resin 11x may not be thermally cured at the same time.

REFERENCE SIGNS LIST

1: Mounting structure
2: Electronic component
3: Wiring board
4: Bump
5: Core substrate
6: Buildup layer
7: Base body
7x: Base body precursor
7y: Resin base layer
8: Electrically-conductive layer
9: Through-hole conductor
10: Insulator
11: First resin portion
11x: Uncured first resin
12: Base material
13: Inorganic insulating particle
13A: First inorganic insulating particle
13B: Second inorganic insulating particle
14: First resin layer
14x: First resin layer precursor
15: Via-conductor
16: Solvent
17: Sol
18: Support sheet
19: Powder layer
20: Stacked body
21: Mixture
22: Laminate sheet
23: Second resin layer
23x: Second resin layer precursor
24: Second resin portion
24x: Uncured second resin
25: Third inorganic insulating particle
G: Gap
R1: First layer region
R2: Second layer region
S: Boundary surface

The invention claimed is:

1. A wiring board, comprising:
a core substrate;
the core substrate including a base body and a first electrically-conductive layer disposed on a main surface of the base body,
the base body including a resin portion, a base material covered with the resin portion, and a plurality of inorganic insulating particles dispersed in the resin portion,
the base body having a first layer region including the base material, and a second layer region located on a main surface of the first layer region, and the second layer region being in contact with the first electrically-conductive layer and the second layer region being disposed between the first layer region and the first electrically-conductive layer,
the plurality of inorganic insulating particles including a plurality of first inorganic insulating particles contained in the first layer region, and a plurality of second inorganic insulating particles contained in the second layer region,
a content rate of the first inorganic insulating particles in the first layer region being lower than a content rate of the second inorganic insulating particles in the second layer region,
wherein an average particle size of the plurality of second inorganic insulating particles is greater than an average particle size of the plurality of first inorganic insulating particles.

2. The wiring board according to claim 1, wherein
buildup layers are disposed on a main surface of the core substrate,
the buildup layers include a first resin layer covering the first electrically-conductive layer, the first resin layer including a resin portion and a plurality of inorganic insulating particles dispersed in the resin portion, and
the first resin layer has a first layer region which is in contact with one main surface and side surfaces of the first electrically-conductive layer, and a second layer region which is located on a side of the first layer region which side is opposite to a first electrically-conductive layer side.

3. The wiring board according to claim 1, wherein the content rate of the first inorganic insulating particles in the first layer region becomes lower gradually from a second layer region side toward the first electrically-conductive layer side.

4. The wiring board according to claim 1, wherein a standard deviation in particle size of the plurality of second inorganic insulating particles is greater than a standard deviation in particle size of the plurality of first inorganic insulating particles.

5. The wiring board according to claim 1, further comprising:
a second resin layer which is disposed on one main surface of a first resin layer which is located on a second layer region side, the second resin layer being smaller in Young's modulus than the first resin layer; and
a second electrically-conductive layer disposed on a main surface of the second resin layer which is opposite to a first resin layer side.

6. A mounting structure, comprising:
the wiring board according to claim 1; and
an electronic component mounted on one main surface of the wiring board.

* * * * *